United States Patent [19]

Lee et al.

[11] Patent Number: 5,273,850

[45] Date of Patent: Dec. 28, 1993

[54] CHROMELESS PHASE-SHIFT MASK AND METHOD FOR MAKING

[75] Inventors: Fourmun Lee, Chandler; Thomas E. Zirkle, Tempe, both of Ariz.

[73] Assignee: Motorola, Inc., Schaumburg, Ill.

[21] Appl. No.: 787,476

[22] Filed: Nov. 4, 1991

[51] Int. Cl.⁵ ............................................. G03F 9/00
[52] U.S. Cl. ......................................... 430/5; 430/22; 430/269; 430/311; 430/396
[58] Field of Search ................. 430/5, 22, 269, 311, 430/396

[56] References Cited

U.S. PATENT DOCUMENTS

5,045,417  9/1991  Okamoto ............................... 430/5

Primary Examiner—Marion E. McCamish
Assistant Examiner—S. Rosasco
Attorney, Agent, or Firm—Gary F. Witting; Joe E. Barbee

[57] ABSTRACT

A method is provided for forming a right angle (30) on a chromeless phase-shift mask (31). A first phase-shift element (32) and a second phase-shift element (33) are positioned at a ninety degree angle, on the chromeless phase-shift mask (31), wherein there is a predetermined space (34) between the first and second phase-shift elements (32,33). The space between the phase-shift elements eliminates hot spot formation that causes unintentional exposure of the semiconductor substrate.

10 Claims, 4 Drawing Sheets

CHROMELESS PHASE-SHIFT MASK AND METHOD FOR MAKING

BACKGROUND OF THE INVENTION

This invention relates, in general, to masks used in making semiconductor devices and, more particularly, to making phase-shift masks.

At present, in the manufacturing of semiconductor devices small features or small geometric patterns are created by using conventional optical photolithography. Typically, optical photolithography is achieved by projecting or by transmitting light through a pattern made of optically opaque areas and optically clear areas on a mask. The optically opaque areas of the pattern block the light, thereby casting shadows and creating dark areas, while the optically clear areas allow the light to pass, thereby creating light areas. Once the light areas and dark areas are formed, they are projected onto and through a lens and subsequently onto a photosensitive layer on a semiconductor substrate. Typically, the lens reduces the light and dark areas or pattern by either 4×, 5×, or 10×. Additionally, all dimensions hereinafter are mask dimensions for a 5× reduction lithographic tool. However, it should be understood that dimensions can be scaled for use with other reduction tools. Projecting light areas and dark areas on the photosensitive layer results in portions of the photosensitive layer being exposed, while other portions of the photosensitive layer will be unexposed.

However, because of increased semiconductor device complexity, which results in increased pattern complexity, increased resolution demands, and increased pattern packing density on the mask, distance between any two opaque areas has decreased. By decreasing the distances between the opaque areas, small apertures are formed which diffract the light that passes through the apertures. The diffracted light results in effects that tend to spread or to bend the light as it passes so that the space between the two opaque areas is not resolved, therefore making diffraction a severe limiting factor for conventional optical photolithography.

A method for dealing with diffraction effects in conventional optical photolithography is achieved by using a chromeless phase-shift mask, which replaces the previously discussed mask. Generally, with light being thought of as a wave, phase shifting with a chromeless phase-shift mask is achieved by effecting a change in timing or by effecting a shift in waveform of a regular sinusoidal pattern of light waves that propagate through a transparent material. Typically, phase shifting is achieved by passing light through areas of a transparent material of either differing thicknesses or through materials with different refractive indexes, thereby changing the phase or the period pattern of the light wave.

Chromeless phase-shift masks reduce diffraction effects by combining both phase shifted light and non-phase shifted light so that constructive and destructive interference takes place. Generally, a summation of constructive and destructive interference of phase-shift masks results in improved resolution and in improved depth of focus of a projected image of an optical system. However, chromeless phase-shift masks have problems when the summation of the constructive and destructive light waves result in inappropriate bright spots or hot spots in a projected pattern. The inappropriate hot spots or bright spots unintentionally exposes portions of the photosensitive layer, thereby creating an incorrect pattern on the photosensitive layer. These hot spots or bright spots typically occur when two phase-shift elements meet. Typically, the phase-shift elements form a right angle or meet an edge of a large feature; however, the bright spots or hot spots occur at varying degrees of intensity in response to angle changes. Accordingly, it is desirable to make a chromeless phase-shift mask that does not produce inappropriate hot spots or bright spots, that can project angles effectively, and that allows for ease in manufacturing, while still achieving the benefits of using a chromeless phase-shift mask.

SUMMARY OF THE INVENTION

Briefly stated, in accordance with the present invention, a method is provided for forming a right angle on a chromeless phase-shift mask. A first phase-shift element is patterned having an end. A second phase-shift element is patterned with a side, wherein the end of the first phase-shift element is positioned at a ninety degree angle to the side of the second phase-shift element with a predetermined space between the end of the first phase-shift element and the side of the second phase-shift element. Further, other angles are capable of being chosen.

DETAILED DESCRIPTION OF THE DRAWINGS

Figure 1A:
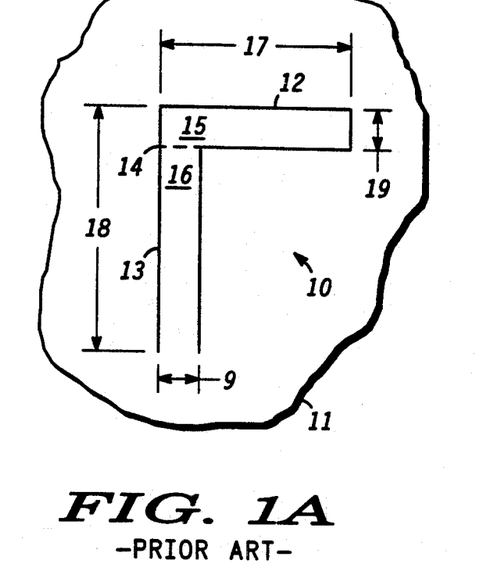
FIG. 1A is a greatly enlarged plan view of a prior art layout for making a right angle on a chromeless phase-shift mask.

FIG. 1A is a greatly enlarged plan view of a prior art layout for making an elbow or a right angle 10 on a chromeless phase-shift mask 11. It should be understood that only a small portion of phase-shift mask 11 is shown and that many more right angles 10 can be defined on phase-shift mask 11. Typically, chromeless phase-shift masks are made by several well-known methods, which are generally discussed in an article by A. K. Pfau, W. G. Oldham, A. R. Neureuther, *EXPLORATION OF FABRICATION TECHNIQUES FOR PHASE-SHIFT MASKS*, SRC Report C90479, September 1990, which is hereby incorporated herein by reference. Additionally, it should be understood that conventional chromeless phase-shift masks 11 are used with commonly used optical photolithography equipment, which illuminates phase-shift mask 11 to project a pattern to a photosensitive layer on a semiconductor substrate. The semiconductor substrate is processed until semiconductor devices are formed.

Right angle 10 is made by joining phase-shift element 12 and phase-shift element 13 at dotted line 14. Phase-shift element 12 and phase-shift element 13 are both made of a phase shifting medium as is described in the incorporated reference. Length 17 of phase-shift element 12 and length 18 of phase-shift element 12 are of any desired length. Typically, line width 19 of phase-shift element 12 and line width 9 of phase-shift element 13 have an optimum width of 1.0 micron when making right angle 10 with an optical system shown in FIG. 7 that uses an illumination wave length of 365 nanometers with a lens that has a numerical aperture of 0.52. However, line widths 9 and 19 using the above mentioned lithographic system has a maximum width of 1.5 microns. Further, it should be understood that the maximum width is dependent on numerical aperture and wave length of illumination light. Typically, reduction of the lens that is used in the optical system is 5×. As is taught in the prior art, phase-shift element 12 and phase-shift element 13 are joined by butting an end 16 of phase-shift element 13 directly against a side region 15 of phase-shift element 12, thereby leaving no space between end 16 and side region 15. By directly butting phase-shift element 12 against an end of phase-shift element 13, constructive and destructive summation problems result when chromeless phase-shift mask 11 is illuminated by the light source.

Figure 1B:
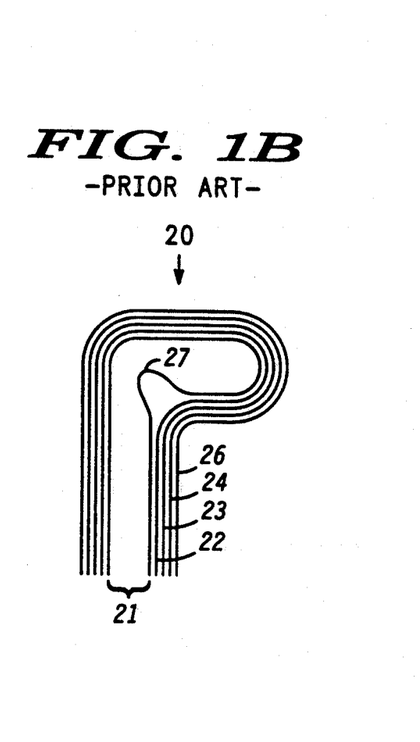
FIG. 1B is a greatly enlarged intensity contour map generated by a computer simulated illumination of prior art layout of FIG. 1A.

FIG. 1B is a greatly enlarged simplified intensity contour map generated by a computer simulated illumination of the prior art layout, shown in FIG. 1A. The computer simulation allows for a detailed examination of effects resulting from the illumination of right angle 10 on chromeless phase-shift mask 11, as shown in FIG. 1A. Further, intensity contour map 20 illustrates an image that is projected onto a semiconductor substrate when chromeless phase-shift mask 11 is used for photolithography. The computer simulated illumination of chromeless phase-shift right angle 10 results in a right angle intensity contour map 20. Intensity contour map 20 is a diagram of relative brightness, which illustrates a projected image from the illumination of right angle 10 on chromeless phase-shift mask 11.

Intensity contour map 20 is made of an area 21 and a plurality of lines representing relative intensities of light. The lines nearest area 21 are designated 22, 23, 24, and 26. By assigning relative intensity values or brightness values to lines 22, 23, 24, and 26 with 1.0 being the brightest and 0.2 being the darkest, the intensity or the amount of light that is projected from illumination of phase-shift mask 11 can be visualized or described. Additionally, it should be understood that relative light intensity values have been simplified in order to more clearly present intensity contour maps 20, 40, 70, 90, 120, and 140. Area 21 has a value of 0.0; therefore, it is the darkest area and blocks the most amount of light. Line 22, which surrounds area 21, is given a relative value of 0.2; therefore, line 22 is slightly brighter than area 21. Line 23, which surrounds line 22, is given a value of 0.4, thus making it slightly brighter than line 22. Line 24 is given a value of 0.6, thus making it a little brighter than line 23. Line 26, which surrounds line 24, is given a value of 0.8, thus making it a little more brighter than line 24. The value of 1.0 is given to the rest of the field that is not defined. It should be understood that intensity changes between lines are smooth.

Region or area 21, however, does not form a sharp 90 degree angle where phase-shift element 12 and phase-shift element 13 meet, as shown in FIG. 1A, but instead forms a hot spot or irregular pattern 27 It should be understood that irregular pattern 27 causes an indentation or removal of a photosensitive material when photo mask 11 is used for photolithography. This indentation or bright spot ultimately causes several problems, such as thinning of the projected line width, which further results in an etched line that has inferior current carrying capability. If the irregular pattern is severe enough, the semiconductor device will not function due to the thinning or removal of the etched line width.

Figure 2A:
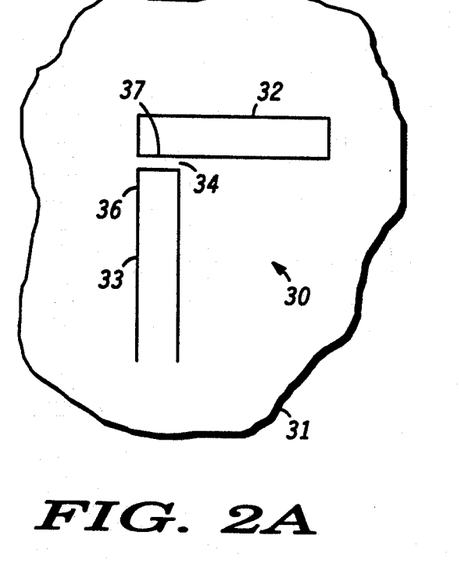
FIG. 2A is a greatly enlarged plan view of an embodiment of the present invention used in making a right angle on a chromeless phase-shift mask.

FIG. 2A is a greatly enlarged plan view of an embodiment of the present invention used in making an elbow or a right angle 30 on a chromeless phase-shift mask 31. Phase-shift element 32 and phase-shift element 33 have similar dimensions as phase-shift element 12 and phase-shift element 13, as previously discussed in FIG. 1A. In the present invention, right angle 30 is made by positioning an end 36 of phase-shift element 33 close to, but not touching, side 37 of phase-shift element 32, thereby leaving a predetermined space 34 between phase-shift element 32 and phase-shift element 33. Additionally, it should be understood that other angles, such as but not limited to 30 degrees, 45 degrees, and 60 degrees are made with phase-shift element 32 and phase-shift element 33. Pullback span or predetermined space 34 is determined by the following formula:

$$\text{Range of Predetermined Space} = \frac{C_1(w1)}{n.a.} \text{ to } \frac{C_2(w1)}{n.a.}$$

where $C_1$ and $C_2$ are empirically derived constants with fixed values of 0.35 and 0.75 respectively, w1 is the wavelength of the illumination of the light source in nanometer, n.a. is the numerical aperture of the lens of the optical system in which the chromeless phase-shift mask 31 is being used. Calculating the first term of the above equation results in a minimum width of the predetermined space 34, and calculating the second term of the above equation results in a maximum width of distance of the predetermined space 34, thereby describing the range of values that predetermined space 34 can be assigned.

By way of example, using an illumination system with a wave length of 0.365 micron, a lens with a numerical aperture of 0.52, and empirically derived constants of 0.35 for C1 and 0.75 for C2 results in a pullback span or a predetermined space 34 that has a range from between 0.25 micron to 0.5 micron.

However, when phase-shift element 32 is made of an opaque material, width of phase-shift element 32 is made to any desirable width. Additionally, when phase-shift element 32 is replaced by an opaque material, it should be understood that predetermined space 34 between phase-shift element 33 and phase-shift element 32 is not required.

Figure 2B:
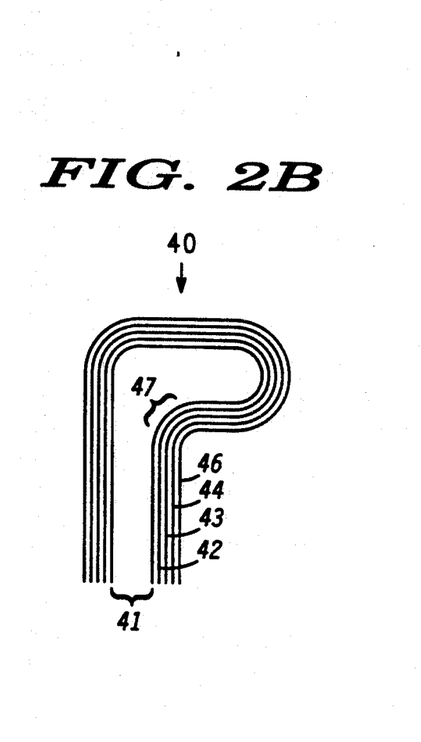
FIG. 2B is a greatly enlarged intensity contour map generated by a computer simulated illumination of an embodiment of the present invention shown in FIG. 2A.

FIG. 2B is a greatly enlarged simplified intensity contour map 40, generated by a computer simulated illumination of chromeless phase-shift mask 31 that is made with an embodiment of the present invention as shown in FIG. 2A. Intensity contour map 40 is made of an area 41 and adjacent lines 42, 43, 44, and 46 plus several others. As previously discussed in FIG. 1B, each area and each line is given a numerical value corresponding to brightness or to an amount of light in that particular location. Area 41 has a value of 0.0; therefore, it is the darkest area and blocks the most amount of light. Line 42, which surrounds area 41, has a value of 0.2, which is slightly brighter then area 41. Line 43, which surrounds line 42, has a value of 0.4, thus is brighter than line 42. Line 44, which surrounds line 43, has a value of 0.6, thus is brighter than line 43. Line 46, which surrounds line 44, is given a value of 0.8, thus making it a little brighter than 44. It should be understood that intensity changes are smooth gradual changes and are not staggered steps.

Region 47 of area 41 corresponds to end 36 of phase-shift element 33 and side 37 of phase-shift element 32, that are positioned with predetermined space 34, as shown in FIG. 2A. By creating a predetermined space 34, the simulated projected image or intensity contour forms a sharper and smoother 90 degree angle, and eliminates hot spot 27, as shown in FIG. 1B. Using the present invention effectively eliminates an opportunity for thinning the projected right angle at region 47. Additionally, by projecting a smoother, sharper 90 degree right angle, greater resolution of smaller right angles and higher densities of right angles are capable of being projected.

Figure 3A:
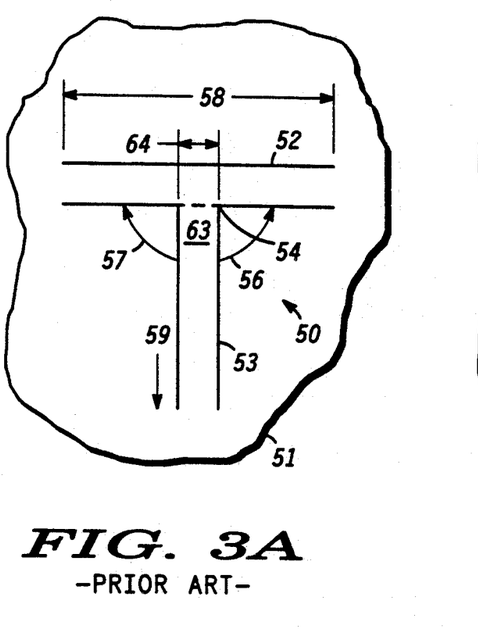
FIG. 3A is a greatly enlarged plan view of a prior art layout for making a tee on a chromeless phase-shift mask.

FIG. 3A is greatly enlarged plan view of a prior art layout for making a tee 50 on a chromeless phase-shift mask 51. Tee 50 is made of a phase-shift element 52 and a phase-shift element 53, with phase-shift element 53 joining phase-shift element 52 at dotted line 54, thereby creating right angle 56 and right angle 57. Line segment 52 and phase-shift element 53 have similar dimensions as Phase-shift element 12 and phase-shift element 13, as previously discussed in FIG. 1A. As has been taught in the prior art, phase-shift element 52 and phase-shift element 53 are joined by directly butting end 63 of phase-shift element 53 against side area 64 of phase-shift element 52, thus leaving no space at dotted line 54. By directly butting phase-shift element 52 and phase-shift element 53 together, constructive and destructive light wave summation problems result when chromeless phase-shift mask 51 is illuminated during use for photolithography.

Figure 3B:
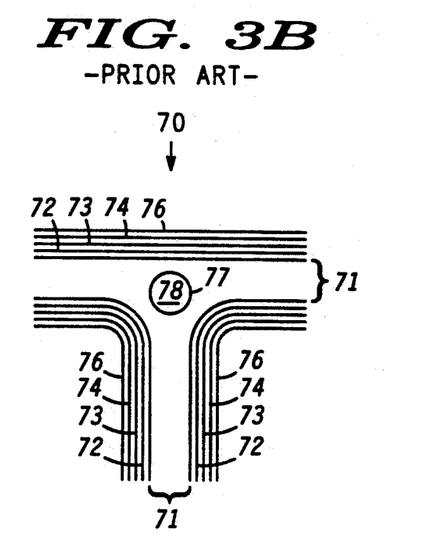
FIG. 3B is a greatly enlarged intensity contour map generated by a computer simulated illumination of prior art layout of FIG. 3A.

FIG. 3B is a greatly enlarged simplified intensity contour map 70, generated by a computer simulated illumination of the prior art layout, shown in FIG. 3A. Intensity contour map 70 is made of an area 71 and adjacent lines 72, 73, 74, and 76 plus several other lines. As previously discussed in FIG. 1B, each area and line is given a numerical value corresponding to brightness or to an amount of light in that particular location. Area 71 has a value of 0.0; therefore, it is the darkest area and blocks the most amount of light. Line 72, which surrounds area 71, has a value of 0.2, which is slightly brighter then area 71. Line 73, which surrounds line 72, has a value of 0.4, thus line 73 is brighter than line 72. Line 74, which surrounds line 73, has a value of 0.6, which is slightly brighter than line 73. Line 76, which surrounds line 74, has a value of 0.8, thus is brighter than line 74. Area outside of intensity contour map 70 is assigned a brightness value of 1.0. It should be understood that intensity changes are smooth gradual changes.

Area 78, defined by line 77, is an area of increased light intensity with a typical value of 0.4 Hot spot or area 78 is generated by a summation of constructive and destructive interferences that results from light passing through chromeless phase-shift mask 51, shown in FIG. 3A. By having hot spot or area 78 projected from mask 51, causes unintentional exposure of a photosensitive material when mask 51 is used for photolithography. Ultimately, this unintentional exposure results in an opening or a hole in an area that corresponds to hot spot 78, thus lowering current carrying capability and decreasing reliability of the semiconductor device that is being made.

Figure 4A:
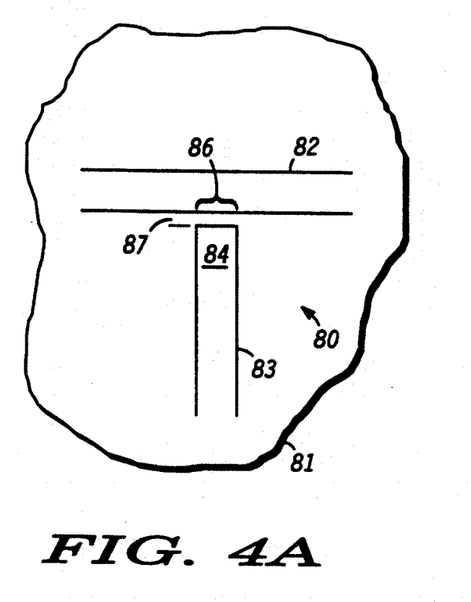
FIG. 4A is a greatly enlarged plan view of an embodiment of the present invention used in making a tee on a chromeless phase-shift mask.

FIG. 4A is a greatly enlarged plan view of an embodiment of the present invention used in making a tee 80 on a chromeless phase-shift mask 81. Phase-shift element 82 and phase-shift element 83 have similar dimensions as phase-shift element 32 and phase-shift element 33 as previously discussed in FIG. 2A. In the present invention, tee 80 is made by positioning an end 84 of phase-shift element 83 close to, but not touching, side 86 of phase-shift element 82, thereby leaving a space 87 between phase-shift element 83 and phase-shift element 82. Determination of space 87 is calculated in a similar manner as has been previously discussed in FIG. 2A.

Additionally, in another embodiment of the present invention, phase-shift element or feature 82 is replaced by an opaque material such as chrome in a form of a bonding pad or a probe pad. Typically, the bonding pad or probe pad is formed as a large rectangular feature. By making the bonding pad or probe pad of opaque material and phase-shift element 83 of chromeless phase-shift material, a composite or combination of opaque material and chromeless phase-shift material is achieved, while still achieving the resolution and depth of focus advantages of the chromeless phase-shift mask. Also when feature 82 is made of an opaque material, predetermined space 87 is not required; however, predetermined space 87 can be incorporated between phase-shifted element 83 and an opaque feature in order to facilitate design procedures. Further, it should be understood that other angles, such as but not limited to 30 degrees, 45 degrees, and 60 degrees are made by positioning feature 82 and phase-shift element 83.

Figure 4B:
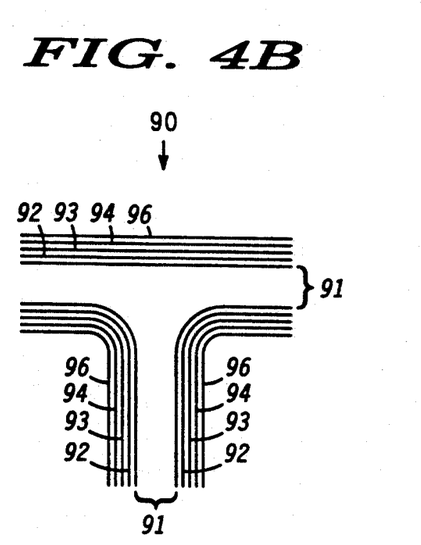
FIG. 4B is a greatly enlarged intensity contour map generated by a computer simulated illumination of an embodiment of the present invention shown in FIG. 4A.

FIG. 4B is a greatly enlarged simplified intensity contour map 90, generated by a computer simulated illumination of chromeless phase-shift mask 81 that is made with an embodiment on the present invention as shown in FIG. 4A. Intensity contour map 90 is made of an area 91 and adjacent lines 92, 93, 94, and 96 plus others. As previously discussed in FIG. 1B, each area and line is given a numerical value corresponding to brightness or to an amount of light in that particular location. Area 91 has a value of 0.0; therefore, it is the darkest area and blocks the most amount of light. Line 92, which surrounds area 91, has a value of 0.2 which is slightly brighter then area 91. Line 93, which surrounds line 92, has a value of 0.4, thus line 93 is brighter than line 92. Line 94, which surrounds line 93, has a value of 0.6, which is slightly brighter than line 93. Line 96, which surrounds line 94, has a value of 0.8, thus is brighter than line 94. Area that is outside of intensity contour map 90 is assigned a brightness value of 1.0. It should be understood that intensity changes are smooth gradual changes.

By creating space 87 shown in FIG. 4A, the computer simulated intensity contour map 90 shows a uniform dark area 91 without hot spot 78, as shown in FIG. 3B. Thus, by using this embodiment of the present invention, elimination of an inappropriate hot spot or area is achieved. By eliminating the inappropriate hot spot 78, allows for an increase in practical resolution, as well as an increase in practical packing densities of tee's.

Figure 5A:
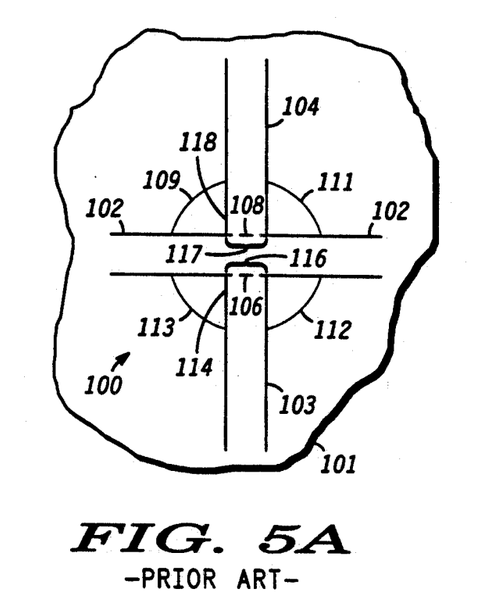
FIG. 5A is a greatly enlarged plan view of a prior art layout for making a cross on a chromeless phase-shift mask.

FIG. 5A is a greatly enlarged plan view of a prior art layout for making a cross 100 on a chromeless phase-shift mask 101. Cross 100 is made of a phase-shift element 102, a phase-shift element 103, and phase-shift element 104, that are joined at dotted line 106 and dotted line 108 respectively, thereby creating cross 100 with right angle 109, right angle 111, right angle 112, and right angle 113. Additionally, it should be understood that joining of phase-shift element 102, phase-shift element 103, and phase-shift element 104, that is indicated by dotted lines 106 and 108 could have been shown by rotating dotted lines 106 and 108 ninety degrees. Phase-shift element 102, phase-shift element 103, and phase-shift element 104 have similar dimensions as phase-shift element 12 and phase-shift element 13, as previously discussed in FIG. 1A. As has been taught in the prior art, phase-shift element 102, phase-shift element 103, and phase-shift element 104 are joined by directly butting end 114 of phase-shift element 103 against side area 116 of phase-shift element 102, and by directly butting end 118 of phase-shift element 104 against side area 117 of phase-shift element 102, thus leaving no space at dotted line 106 and dotted line 108. By directly butting phase-shift element 102, phase-shift element 103, and phase-shift element 104 together to form cross 100, constructive and destructive light summation problems result when chromeless phase-shift mask 101 is illuminated during use for photolithography.

Figure 5B:
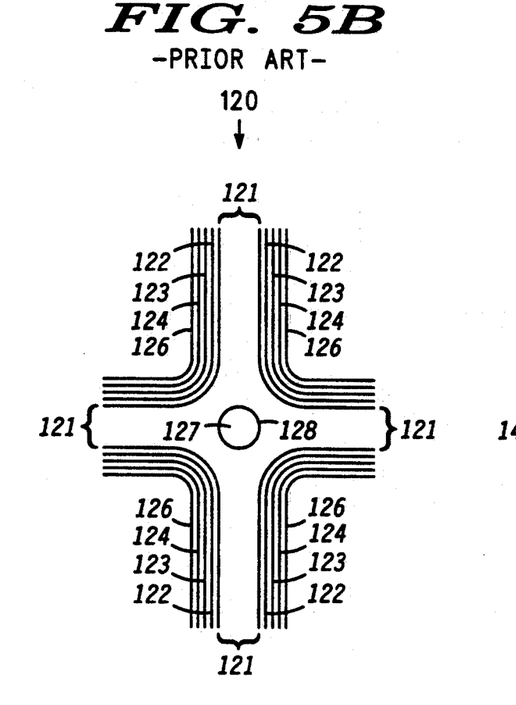
FIG. 5B is a greatly enlarged intensity contour map generated by a computer simulated illumination of prior art layout of FIG. 5A.

FIG. 5B is a greatly enlarged simplified intensity contour map 120, generated by a computer simulated illumination of chromeless phase-shift mask 101 that is made with an embodiment of the present invention as shown in FIG. 5A. Generally, intensity contour map 120 is made of area 121 and adjacent lines 122, 123, 124, and 126 plus several others. As previously discussed in FIG. 1B, each area and line is given a numerical value corresponding to brightness or to an amount of light in that particular location. Area 121 has a value of 0.0; therefore, it is the darkest area and blocks the most amount of light. Line 122, which surrounds area 121, has a value of 0.2, which is slightly brighter than area 121. Line 123, which surrounds line 122, has a value of 0.4, thus line 123 is slightly brighter than line 122. Line 124, which surrounds line 123, has a value of 0.6, which is slightly brighter than line 123. Line 126 which surrounds line 124 has a value of 0.8, is brighter than line 124. Area outside of intensity contour map 120 is assigned a brightness value of 1.0. It should be understood that intensity changes are smooth gradual changes.

Area 127, defined by line 128, is an area of increased intensity with a typical value of 0.4. Hot spot or area 127 is generated by a summation of constructive and destructive interferences that results from light passing through chromeless phase-shift mask 101, as shown in FIG. 5A. By having hot spot or area 127 projected from mask 101, causes unintentional exposure of a photosensitive material when mask 101 is used for photolithography. Ultimately, the unintentional exposure of the photosensitive material results in an unwanted opening or unwanted hole that corresponds to hot spot 127. Upon subsequent processing, this hole is transferred into the substrate below.

Figure 6A:
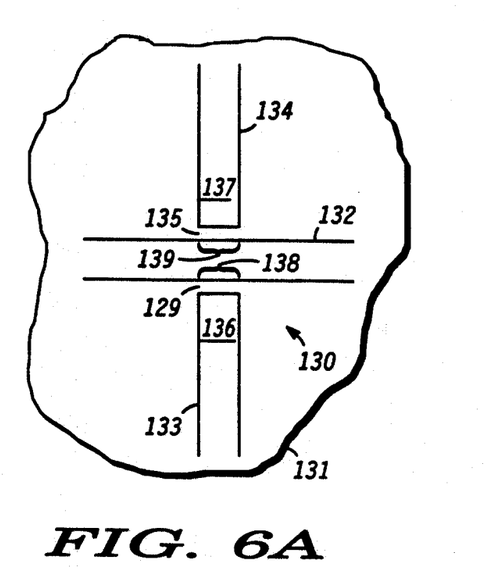
FIG. 6A is a greatly enlarged plan view of an embodiment of the present invention used in making a cross on a chromeless phase-shift mask.

FIG. 6A is a greatly enlarged plan view of an embodiment of the present invention used in making a cross 130 on chromeless phase-shift mask 131. Phase-shift element 132, phase-shift element 133, and phase-shift element 134 have similar dimensions as phase-shift element 32 and phase-shift element 33 as previously discussed in FIG. 2A. In the present invention, cross 130 is made by positioning an end 136 of phase-shift element 133, and end 137 of phase-shift element 134 close to, but not touching, side area 138 and side area 139 respectively, thereby leaving a space 129 and a space 135 respectively, between phase-shift element 132 and phase-shift elements 133 and 134. Determination of spaces 129 and 135 is calculated in a similar manner as has been previously discussed in FIG. 2A. Further, it should be understood that other angles, such as but not limited to 30 degrees, 45 degrees, and 60 degrees are made by positioning phase-shift element 132, phase-shift element 133, and phase-shift element 134.

Figure 6B:
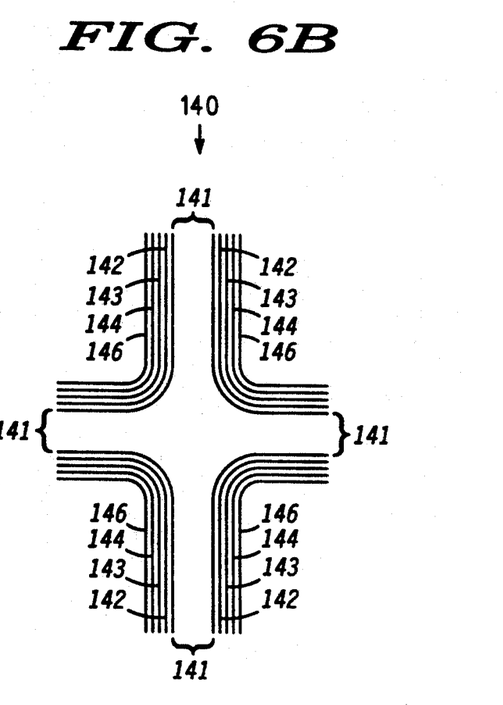
FIG. 6B is a greatly enlarged intensity contour map generated by a computer simulated illumination of an embodiment of the present invention shown in FIG. 6A.

FIG. 6B is a greatly enlarged simplified intensity contour map 140, generated by a computer simulated illumination of chromeless phase-shift mask 131 that is made with an embodiment of the present invention as shown in FIG. 6A. Intensity contour map 140 is made of an area 141 and adjacent lines 142, 143, 144, and 146 plus several other lines. As previously discussed in FIG. 1B, each area and line is given a numerical value corresponding to brightness or to an amount of light in that particular location. Area 141 has a value of 0.0; therefore, it is the darkest area and blocks the most amount of light. Line 142, which surrounds area 141, has a value of 0.2, which is slightly brighter than area 141. Line 143, which surrounds line 142, has a value of 0.4, thus line 143 is slightly brighter than line 142. Line 144, which surrounds line 143, has a value of 0.6, which is slightly brighter than line 143. Line 146 which surrounds line 144 has a value of 0.8, is brighter than line 144. Area outside of intensity contour map 140 is assigned a brightness value of 1.0. It should be understood that intensity changes are smooth, gradual changes.

By creating space 129 and space 135 shown in FIG. 6A, the computer simulated intensity contour map 140 shows a uniform dark area 141 without hot spot 127, as shown in FIG. 5B. Using this embodiment of the present invention, results in elimination of inappropriate projection of hot spots, which further results in additional capability for increased resolution and increased packing density.

Figure 7:
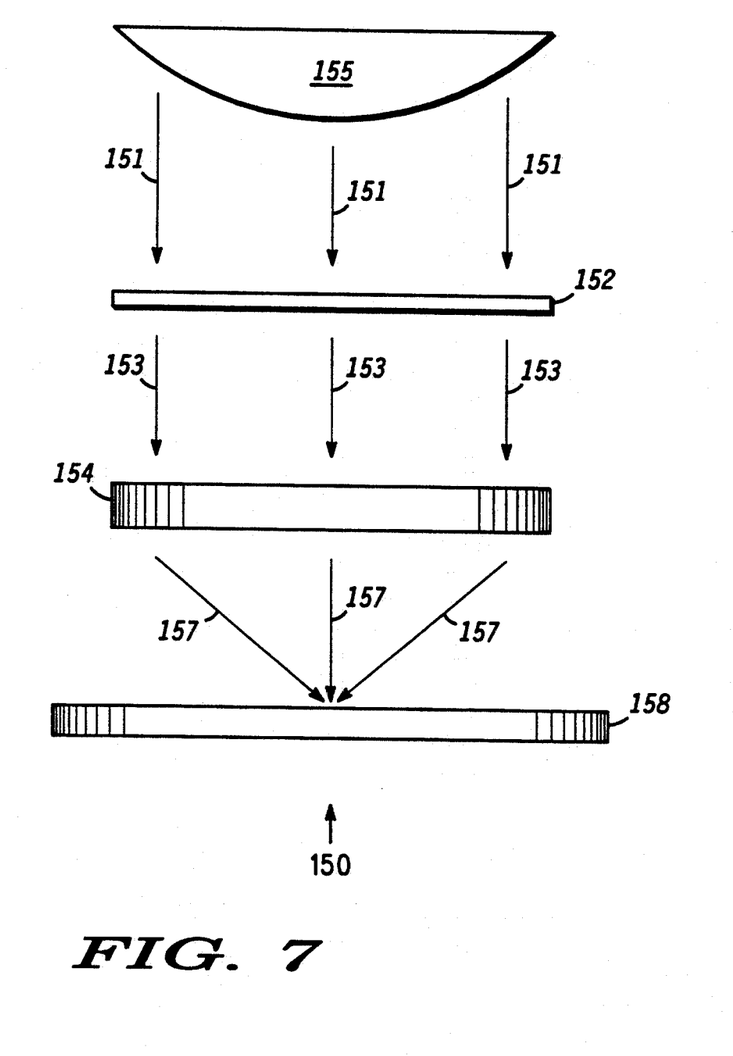
FIG. 7 pictorially illustrates an optical system that uses the present invention.

FIG. 7 pictorially illustrates an optical system 150 that uses a chromeless phase-shift mask that uses the present invention. Generally, illumination source 155 is a mercury arc lamp which emits commonly used frequencies, such as I-line (365 nanometers) and G-line (436 nanometers). However, other sources of illumination can be used, such as deep ultraviolet, and ultraviolet. Arrows 151 illustrate illumination that is directed from illumination source 155 towards a chromeless phase-shift mask 152 which can be mask 31, 81, or 131. The illumination, that is depicted by arrows 151, then passes through chromeless phase-shift mask 152, where the illumination wave form changes. Arrows 153 illustrate the effective illumination after passing through chromeless phase-shift mask 152. Illumination depicted by arrows 153 falls on a lens 154. Numerical aperture of lens 154, generally, ranges between values of 0.25 to 0.65. However, it should be understood that numerical aperture is a physical attribute of the lens optics, and numerical aperture will improve or approach a theoretical limit as lens optics improves, e.g., numerical aperture will approach 1.0. Typically, lens 154 is a reduction lens which reduces an image that is made by phase-shift mask 152. This reduced image is projected onto a surface of a semiconductor substrate 158. Arrows 157 represent the projection of the reduced image from lens 154 to semiconductor substrate 158.

By now it should be appreciated that a novel method and design has been described for making chromeless phase-shift masks. The design and method eliminates inappropriate and unwanted projection of light, that reduces usefulness of chromeless phase-shift masks. Additionally, by using the present invention, the practical resolution of the optical system is increased, as well as allowing for greater packing densities. This invention is particularly useful when making right angles and intersecting lines on a semiconductor device.

We claim:

1. A chromeless phase-shift mask comprising:
   a chromeless phase-shift mask;
   a first phase-shift element having an end formed on the mask; and
   a second phase-shift element formed on the chromeless phase-shift mask and having a side, wherein the end of the first phase-shift element is positioned adjacent the side of the second phase-shift element with a predetermined space ranging between 0.25 and 0.5 micron therebetween.

2. The phase-shift mask of claim 1 wherein the maximum line width is 1.5 micron.

3. A phase-shift mask having patterns of phase-shift elements located thereon comprising:
   a phase-shift mask;
   a first phase-shift element having an end with a maximum width of 1.5 microns formed on the phase-shift mask; and
   a second phase-shift element formed on the phase-shift mask and having a side, wherein the end of the first phase-shift element is positioned adjacent to the side of the second phase-shift element with a predetermined space between the end of the first phase-shift element and the side of the second phase-shift element, thereby forming a right angle from the first and the second phase-shift elements with the predetermined space ranging between 0.25 and 0.5 micron therebetween.

4. The right angle of claim 3 wherein the first phase-shift element is chromeless.

5. A chromeless phase-shift mask having patterns of phase-shift elements comprising:
   a chromeless phase-shift mask;
   a chromeless phase-shift element having an end formed on the chromeless phase-shift mask; and an opaque element formed on the chromeless phase-shift mask and having a side, wherein the end of the chromeless phase-shift element is positioned adjacent to the side of the opaque lines feature with a predetermined space ranging between 0.25 and 0.5 micron therebetween.

6. A composite joint of claim 5 wherein the maximum line width of the first phase-shift element is 1.5 micron.

7. A chromeless phase-shift mask having pattern of phase-shift elements disposed thereon comprising:
   a chromeless phase-shift mask;
   a first phase-shift element having a first and second side formed on the chromeless phase-shift mask;
   a second phase-shift element having an end with a maximum width of 1.5 microns and formed on the chromeless phase-shift mask; and
   a third phase-shift element having an end with a maximum width of 1.5 micron different from that of the second phase-shift element and an end, wherein the end of the second phase-shift element is positioned adjacent the first side of the first phase-shift element with a predetermined space therebetween and the end of the third phase-shift element is positioned adjacent the second side of the first phase-shift element substantially opposite to the second phase-shift element with the predetermined space ranging between 0.25 and 0.5 micron therebetween.

8. A method for forming a geometric right angle on a chromeless phase-shift mask:
   providing a chromeless phase-shift mask plate;
   patterning the chromeless phase-shift mask plate with a first phase-shift element having an end;
   calculating a range for a predetermined space by the following formula:

$$\text{Range of Predetermined Space} = \frac{C_1(w1)}{n.a.} \text{ to } \frac{C_2(w1)}{n.a.}$$

wherein $C_1$ is a first empirically derived constant of 0.35, $C_2$ is a second empirically derived constant of 0.75, w1 is the wavelength of illumination, and n.a. is the numerical aperture or a lens system; and
   patterning the chromeless phase-shift mask plate with a second phase-shift element so that a right angle is formed by the first phase-shift element and the second phase-shift element, wherein the predetermined space is formed that separates the end of the first phase-shift element from a side of the second phase-shift element.

9. A method of making a cross on a chromeless phase-shift mask comprising:
   providing a chromeless phase-shift mask plate;
   patterning the chromeless phase-shift mask plate with a first phase-shift element with a first and second side;
   calculating a range for a predetermined space by the following formula:

$$\text{Range of Predetermined Space} = \frac{C_1(w1)}{n.a.} \text{ to } \frac{C_2(w1)}{n.a.}$$

wherein $C_1$ is a first empirically derived constant of 0.35, $C_2$ is a second empirically derived constant of 0.75, w1 is the wavelength of illumination, and n.a. is the numerical aperture of a lens system;

patterning the chromeless phase-shift mask plate with a second phase-shift element having an end, wherein the end of the second phase-shift element is positioned with the predetermined space adjacent the first side of the first phase-shift element; and patterning the chromeless phase-shift mask plate with a third phase-shift element having an end, wherein the end of the third phase-shift element is positioned with the predetermined space adjacent the second side of the first phase-shift element, thereby creating a chromeless phase-shift cross.

10. A method for projecting patterns onto a semiconductor substrate comprising:

providing an illumination source;

providing a phase-shift mask that has a predetermined space ranging between 0.25 and 0.5 micron between a first phase-shift element and a side of a second phase-shift element;

providing a lens system that receives the pattern that is projected from the phase-shift mask;

reducing the pattern in the lens system; and projecting the reduced pattern onto a semiconductor substrate.

* * * * *

UNITED STATES PATENT AND TRADEMARK OFFICE
CERTIFICATE OF CORRECTION

PATENT NO. : 5,273,850
DATED : December 28, 1993
INVENTOR(S) : Lee et al.

It is certified that error appears in the above-indentified patent and that said Letters Patent is hereby corrected as shown below:

Column 10, claim 5, line 4, delete "lines" and insert therefor --line--.

Column 10, claim 6, line 7, delete "A composite" and insert therefor --The composite--.

Column 10, claim 7, line 9, delete "pattern" and insert therefor --patterns--.

Column 10, claim 8, line 44, delete "aperture or" and insert therefor --aperature of--.

Column 10, claim 9, line 52, delete "method of" and insert therefor --method for--.

Signed and Sealed this

Seventh Day of February, 1995

Attest:

BRUCE LEHMAN

*Attesting Officer*   *Commissioner of Patents and Trademarks*